(12) United States Patent
Levi et al.

(10) Patent No.: US 12,190,971 B2
(45) Date of Patent: Jan. 7, 2025

(54) MANAGING MEMORY LEAKAGES OF A SYSTEM FOR EVALUATING MANUFACTURED ITEMS

(71) Applicant: APPLIED MATERIALS ISRAEL LTD., Rehovot (IL)

(72) Inventors: Elad Levi, Rehovot (IL); Eliraz Busi, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 184 days.

(21) Appl. No.: 18/095,880

(22) Filed: Jan. 11, 2023

(65) Prior Publication Data
US 2024/0233848 A1   Jul. 11, 2024

(51) Int. Cl.
*G11C 29/04* (2006.01)

(52) U.S. Cl.
CPC ...... *G11C 29/04* (2013.01); *G11C 2029/0403* (2013.01)

(58) Field of Classification Search
CPC .......... G11C 29/04; G11C 2029/0403
See application file for complete search history.

(56) References Cited

U.S. PATENT DOCUMENTS

| 2008/0301504 A1* | 12/2008 | Chen ............ G06F 11/008 714/42 |
| 2023/0214321 A1* | 7/2023 | Singh ............ G06F 9/321 711/154 |

* cited by examiner

*Primary Examiner* — Han Yang
(74) *Attorney, Agent, or Firm* — Kilpatrick Townsend & Stockton LLP

(57) ABSTRACT

A system for evaluating manufactured items that includes a memory module; an evaluation unit configured to execute instructions related to the evaluating of the manufactured items while applying a group of features; and a memory leakage unit configured to: select a first feature out of the group of features and disable an execution, by the evaluation unit, of instructions associated with the first feature at a presence of a memory leakage event. The first feature has a priority that is lower than a priority of a second feature of the group of feature. Priorities of features of the group of features are determined based on (i) priority information provided by one or more developers of the instructions related to the evaluating of the manufactured item, and (ii) usage information indicative of usage of the features of the group of features by the evaluation unit.

20 Claims, 4 Drawing Sheets

```
┌─────────────────────────────────────────────────────────────┐
│ Obtaining priorities of features of a group of features     │
│ applied by an evaluation unit while executing instructions  │
│ related to the evaluating of the manufactured items  105    │
└─────────────────────────────────────────────────────────────┘
                              │
                              ▼
┌─────────────────────────────────────────────────────────────┐
│ Selecting, by a memory leakage unit, a first feature out of │
│ a group of features applied by an evaluation unit while     │
│ executing instructions related to the evaluating of the     │
│ manufactured items, the evaluation unit belongs to the      │
│ system for evaluating manufactured items; wherein the       │
│ first feature has a priority that is lower than a priority  │
│ of a second feature of the group of features; wherein       │
│ priorities of features of the group of features are         │
│ determined based on (i) priority information provided by    │
│ one or more developers of the instructions related to the   │
│ evaluating of the manufactured item, and (ii) usage         │
│ information indicative of usage of the features of the      │
│ group of features by the evaluation unit  110               │
└─────────────────────────────────────────────────────────────┘
                              │
                              ▼
┌─────────────────────────────────────────────────────────────┐
│ Detecting a memory leakage event, by the memory leakage     │
│ unit 120                                                    │
└─────────────────────────────────────────────────────────────┘
                              │
                              ▼
┌─────────────────────────────────────────────────────────────┐
│ Disabling an execution, by the evaluation unit, of          │
│ instructions associated with the first feature at a         │
│ presence of a memory leakage event 130                      │
└─────────────────────────────────────────────────────────────┘

┌─────────────────────────────────────────────────────────────┐
│ Applying, by an access control unit, access control rules   │
│ on the usage information 140                                │
└─────────────────────────────────────────────────────────────┘

MANAGING MEMORY LEAKAGES OF A SYSTEM FOR EVALUATING MANUFACTURED ITEMS

BACKGROUND OF THE INVENTION

Manufactured items such as semiconductor wafers are manufactured by a highly complex manufacturing process. Such manufactured items are evaluated in various manners including, for example, defect detection, defect review, metrology, and the like.

The manufactured items may be evaluated by various systems such as charged particle microscopes, optical inspection systems, optical metrology systems, charged particles metrology systems, review systems, and the like Systems for evaluating the manufactured items are highly complex, have extensive computational power, and may execute multiple complex programs during the evaluation of the items.

Memory leakage may occur, for example, when memory which is no longer needed is not released. A memory leakage may result in draining the memory resources of a system for evaluating the manufactured items and this may cause the system for evaluating the manufactured items to stop working.

Due to the number of programs executed by the system for evaluating the manufactured items, the vast number of combinations of concurrently executed programs executed by the system for evaluating the manufactured items, and the complexity of the programs executed by the system for evaluating the manufactured items, memory leakage may occur in the system for evaluating the manufactured items and it is also hard to predict when memory leakage may occur in the system for evaluating the manufactured items.

Furthermore, customers of systems for evaluating manufactured item tend not to share with other parties their usage of the system for evaluating the manufactured item. This prevents the developers of the system for evaluating the manufactured item to estimate when memory leakage may occur.

There is a growing need to manage memory leakage occurring in systems for evaluating the manufactured items, in an effective manner.

BRIEF SUMMARY OF THE INVENTION

There may be provided a system for evaluating manufactured items, the system may include (a) a memory module; (b) an evaluation unit that is configured to execute instructions related to the evaluating of the manufactured items while applying a group of features; and (c) a memory leakage unit that is configured to: (c.1) select a first feature out of the group of features; wherein the first feature has a priority that is lower than a priority of a second feature of the group of features; wherein priorities of features of the group of features are determined based on (i) priority information provided by one or more developers of the instructions related to the evaluating of the manufactured item, and (ii) usage information indicative of usage of the features of the group of features by the evaluation unit; and (c.2) disable an execution, by the evaluation unit, of instructions associated with the first feature at a presence of a memory leakage event.

There may be provided a method for managing memory leakages of a system for evaluating manufactured items, the method may include (a) selecting, by a memory leakage unit, a first feature out of a group of features applied by an evaluation unit while executing instructions related to the evaluating of the manufactured items, the evaluation unit belongs to the system for evaluating manufactured items; wherein the first feature has a priority that is lower than a priority of a second feature of the group of features; wherein priorities of features of the group of features are determined based on (i) priority information provided by one or more developers of the instructions related to the evaluating of the manufactured item, and (ii) usage information indicative of usage of the features of the group of features by the evaluation unit; and (b) disabling an execution, by the evaluation unit, of instructions associated with the first feature at a presence of a memory leakage event.

There may be provided a non-transitory computer readable medium for managing memory leakages of a system for evaluating manufactured items, the non-transitory computer readable medium stores instructions that once executed by a memory leakage unit, causes the memory leakage unit to: (a) select a first feature out of a group of features applied by an evaluation unit while executing instructions related to the evaluating of the manufactured items, the evaluation unit belongs to the system for evaluating manufactured items; wherein the first feature has a priority that is lower than a priority of a second feature of the group of features; wherein priorities of features of the group of features are determined based on (i) priority information provided by one or more developers of the instructions related to the evaluating of the manufactured item, and (ii) usage information indicative of usage of the features of the group of features by the evaluation unit; and (b) disable an execution, by the evaluation unit, of instructions associated with the first feature at a presence of a memory leakage event.

BRIEF DESCRIPTION OF THE DRAWINGS

The subject matter regarded as the one or more embodiments of the application is particularly pointed out and distinctly claimed in the concluding portion of the specification. The one or more embodiments of the application, however, both as to organization and method of operation, together with objects, features, and advantages thereof, may best be understood by reference to the following detailed description when read with the accompanying drawings in which:

FIG. 3 illustrates an example of a method; and

DETAILED DESCRIPTION OF THE INVENTION

Figure 1:
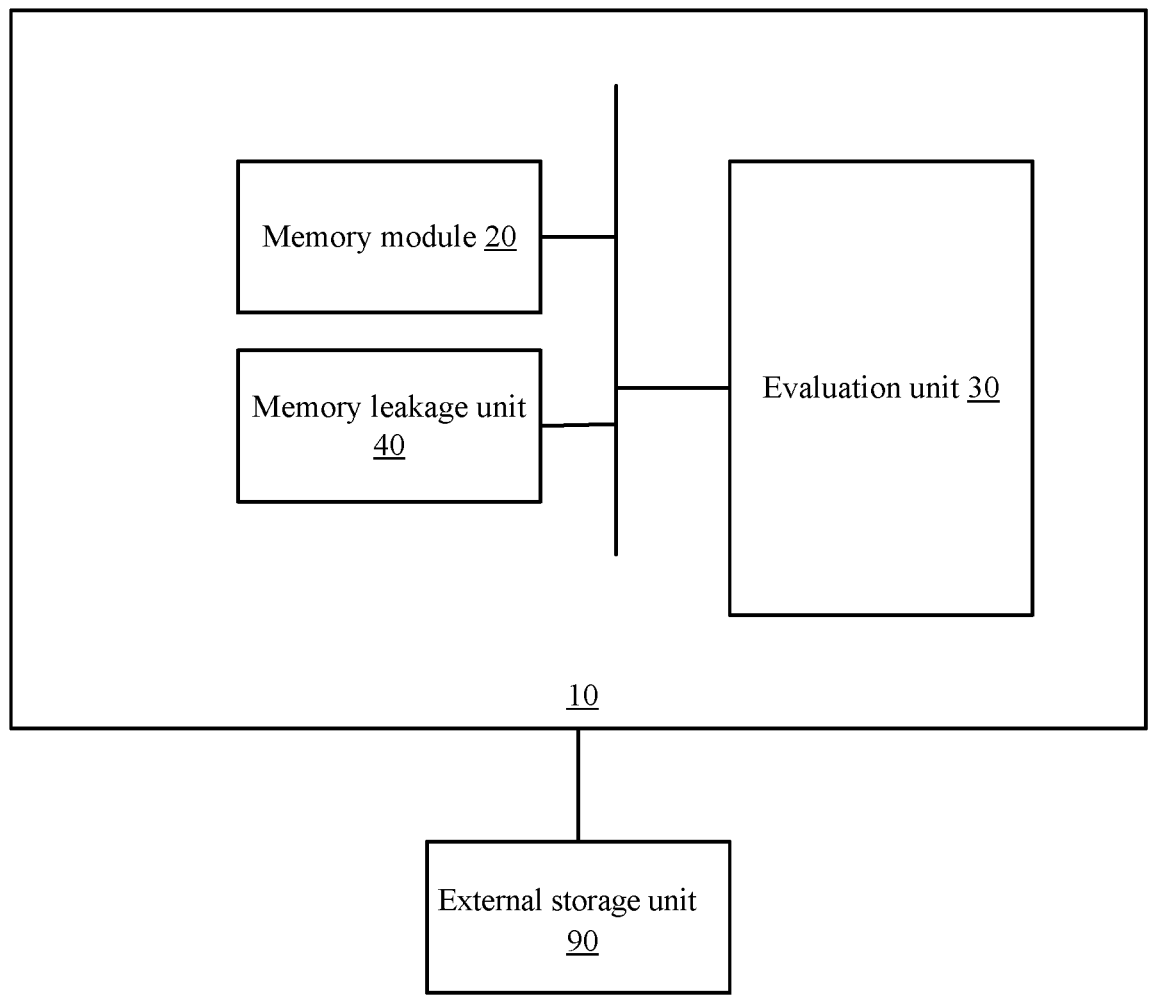
FIG. 1 illustrates an example of a system for evaluating manufactured items.

In the following detailed description, numerous specific details are set forth in order to provide a thorough understanding of the one or more embodiments of the application. However, it will be understood by those skilled in the art that the present one or more embodiments of the application may be practiced without these specific details. In other instances, well-known methods, procedures, and components have not been described in detail so as not to obscure the present one or more embodiments of the application.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the application may for the most part, be implemented using electronic components and circuits known to those skilled in the art, details will not be explained in any greater extent than that considered necessary as illustrated above, for the understanding and appreciation of the underlying concepts of the present one or more embodiments of the application and in order not to obfuscate or distract from the teachings of the present one or more embodiments of the application.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that can be executed by the system and should be applied mutatis mutandis to a non-transitory computer readable medium that stores instructions that once executed by a computer result in the execution of the method.

A processing circuit may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

FIG. 1 is an example of a system 10 for evaluating manufactured items and of an external storage unit 90. The storage unit may be included in system 10.

System 10 may include memory module 20, an evaluation unit 30 and a memory leakage unit 40.

Memory module 20 may be used to store instructions and/or data obtained during the evaluation process.

The evaluation unit 30 may be an optical evaluation unit that uses optical radiation such as light, ultraviolet (UV) radiation, deep UV radiation, or extreme deep UV radiation to evaluate manufactured items. The evaluation unit may be a charged particle unit that uses charged particles such as electrons or ions to evaluate manufactured items. The evaluation unit may include at least one of electron optics, optical optics, ion optics, one or more collection paths, one or more illumination paths, one or more sensors, one or more radiation sources, one or more memory units, or one or more processing circuits.

The evaluation unit 30 is configured to execute instructions related to the evaluating of the manufactured items while applying a group of features. Examples of features may include, for example, evaluation features, features related to the usage of the system, recipe related features, features related to image processing or to any other aspect of the evaluation, features related to a man machine interface, and the like.

An evaluation feature may define a manner in which a manufactured item is evaluated—for example a feature may be a certain defect detection algorithm such as die to reference comparison, cell to cell comparison, die to golden die comparison, and the like.

The system may perform the evaluation using a recipe that determines features of the evaluation process such as an energy of an electron beam, an illumination polarization, a selection of detectors, a shape of an illumination beam, collection angle, collection polarization, scan pattern, and the like.

Additional examples of features may include edge detection features, area segmentation features, a recipe creation feature, a man machine interface feature, and the like.

Memory leakage unit 40 may include one or more processing circuits, memory resources and one or more communication resources for communicating with memory module 20 or with the evaluation unit.

Memory leakage unit 40 is configured to: (i) obtain priorities of features of the group of features, (ii) select one or more features (based on the features priorities—selecting the lower priority one or more features) to disable in case of an occurrence of a memory leakage event, and (ii) disable the execution of the one or more features by the evaluation unit, upon an occurrence of the memory leakage event.

The priorities of features of the group of features may be determined based on (i) priority information provided by one or more developers of the instructions related to the evaluating of the manufactured item, and (ii) usage information indicative of usage of the features of the group of features by the evaluation unit. The usage information may be indicative of usage of features by other evaluation units, for example evaluation units of the same factory, of the same client, and the like.

Determining the priorities based on (i) the priority information provided by one or more developers and (ii) the usage information benefits from the knowledge of developers related to the software they developed, and which is used in relation to the evaluation of items—and also benefits from the usage of the feature by the clients—which in many cases is not shared with the developers. The combination of priority information provided by one or more developers and the usage information provides highly accurate prioritization of the features—that is tailored to the usage of the system to the specific user.

In an example, the one or more features selected by the memory leakage unit may be a first feature. The first feature has a priority that is lower than a priority of a second feature of the group of features. At a presence of a memory leakage event the memory leakage unit may be configured to disable an execution, by the evaluation unit, of instructions associated with the first feature at a presence of a memory leakage event. The second feature may not be disabled as it has a higher priority.

In another example the one or more features selected by the memory leakage unit may include the first feature and one or more additional features. The memory leakage unit may select the first feature and the one or more additional features out of the group of features, and disable an execution, by the evaluation unit, of instructions associated with the first feature and the one or more additional features at the presence of the memory leakage event. A priority of each one of the one or more additional features is lower than a priority of the second feature.

The number of features to be disabled may be determined based on the magnitude of the memory leakage event. The number of features to be disabled may also be determined based on a status of the memory module, especially currently available memory resources and may also be responsive to the expected future usage of the memory resources. More features may be disabled when the currently available memory resources are lower and/or the future usage of memory resources is higher.

The memory leakage unit 40 may be configured to detect the memory leakage event. This may involve monitoring the usage of the memory unit and may also include obtaining information about the software that is executed by the evaluation unit. When there is no memory leakage there is an expected or known relationship between memory consumption and the software executed by the evaluation unit. When there is a memory leakage the memory consumption exceeds the expected or known relationship.

The detecting of a memory leakage may occur when the available memory space reduces at a rate that exceeds a certain rate and/or when the available memory space reduces at a manner that exceed the an expected manner given the software executed by the evaluation unit.

The memory leakage event may be detected when it is actually occurring or may be detected (or rather predicted) before occurring. Accordingly, the memory leakage event may be a current memory leakage event or a future memory leakage event.

The disabling may include preventing an execution of the instructions associated with the first feature—if the instructions are not executed when the memory leakage unit decided to disable the instructions.

The disabling may include stopping the execution of the instructions (or the execution of a software that includes the instructions) —when the memory leakage unit determined to disable the instructions while the instructions are already executed. In this case the memory leakage unit may preserve the state of execution of the instructions, for example by storing the state in a storage unit. This allows to resume the execution of the instructions, from the point they were stopped, by retrieving their status. The external storage unit 90 may store the state of execution of the instructions.

Figure 2:
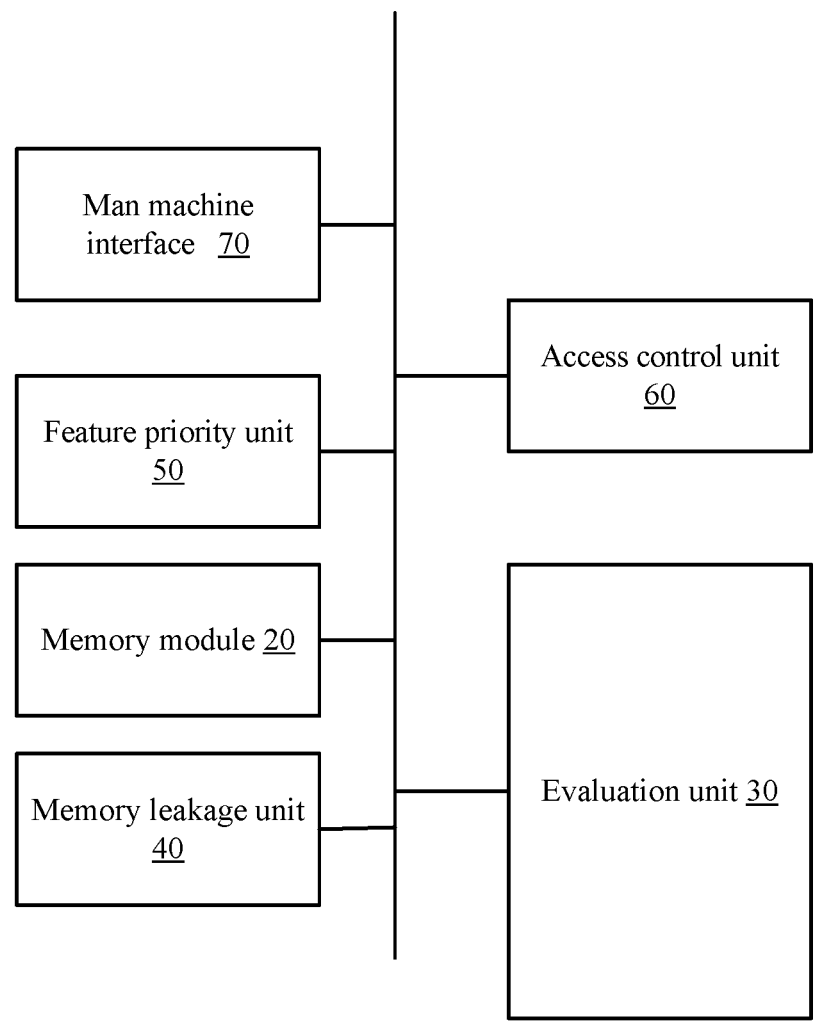
FIG. 2 illustrates an example of a system for evaluating manufactured items.

FIG. 2 is an example of a system 11 for evaluating manufactured items.

System 11 includes memory module 20, evaluation unit 30, memory leakage unit 40, feature priority unit 50, access control unit 60 and man machine interface (MMI) 70 for interfacing with one or more users of the system.

MMI 70 may include a screen, a touch screen, a keyboard, a joystick, a voice controlled MMI, and the like.

Feature priority unit 50 is configured to determine the priorities of features of the group of features.
  a. Receiving the priority information provided by one or more developers of the instructions related to the evaluating of the manufactured item.
  b. Obtaining the usage information indicative of usage of the features of the group of features by the evaluation unit. The obtaining may include receiving the usage information from another entity—such as usage monitor (not shown). Alternatively—the obtaining may include generating the usage information by monitoring after the usage of the feature of the group of feature by the system 11.
  c. Applying any priority calculation function on the usage information and the priority information provided by one or more developers to determine the priorities of the features.
  d. Determining the priorities by calculating usage related priorities to the features of the group of features, based on the usage information; wherein features of higher usage are allocated with higher usage related priorities.
  e. Allocating less weight to the usage information of features that are labeled as critical in the priority information, in comparison to usage information of features that are not labeled as critical in the priority information.
  f. Receive feedback from one or more users of the systems regarding required priorities of the features of the group—and determine the priorities in response to priority feedback provided by one or more users of the system. The feedback may include the importance of features to the one or more users. The users may request not to disable certain features, or to disable certain features only when certain circumstances occur. The users may provide feature importance values—that may be binary values or non-binary values that are indicative of the importance of the features.
  g. Applying any priority calculation function on the usage information, the priority information provided by one or more developers, and the feedback from one or more users to determine the priorities of the features.

The access control unit 60 may be configured to apply access control rules on the usage information. For example, prevent the usage information to be accessed by computerized system of the developers or to other third parties.

FIG. 3 illustrates an example of method 100 for managing memory leakages of a system for evaluating manufactured items.

Method 100 may include step 105 of obtaining priorities of features of a group of features applied by an evaluation unit while executing instructions related to the evaluating of the manufactured items.

Step 105 may include at least one of the following:
  a. Receiving the priorities of the features.
  b. Determining the priorities of the features.
  c. Receiving a priority of one or more features of the group and determining a priority of at least one other feature of the group.
  d. Receiving the priority information provided by one or more developers of the instructions related to the evaluating of the manufactured item.
  e. Obtaining the usage information indicative of usage of the features of the group of features by the evaluation unit. The obtaining may include receiving the usage information from another entity—such as usage monitor (not shown). Alternatively—the obtaining may include generating the usage information by monitoring after the usage of the feature of the group of feature by the system.
  f. Applying any priority calculation function on the usage information and the priority information provided by one or more developers to determine the priorities of the features.
  g. Determining the priorities by calculating usage related priorities to the features of the group of features, based on the usage information; wherein features of higher usage are allocated with higher usage related priorities.
  h. Allocating less weight to the usage information of features that are labeled as critical in the priority information, in comparison to usage information of features that are not labeled as critical in the priority information.
  i. Receive feedback from one or more users of the systems regarding required priorities of the features of the group—and determine the priorities in response to priority feedback provided by one or more users of the system. The feedback may include the importance of features to the one or more users. The users may request not to disable certain features, or to disable certain features only when certain circumstances occur. The users may provide feature importance values—that may be binary values or non-binary values that are indicative of the importance of the features.
  j. Applying any priority calculation function on the usage information, the priority information provided by one or more developers, and the feedback from one or more users to determine the priorities of the features.

Step 105 may be followed by step 110 of selecting, by a memory leakage unit, a first feature out of a group of features applied by an evaluation unit while executing instructions related to the evaluating of the manufactured items, the evaluation unit belongs to the system for evaluating manufactured items; wherein the first feature has a priority that is lower than a priority of a second feature of the group of features; wherein priorities of features of the group of features are determined based on (i) priority information provided by one or more developers of the instructions related to the evaluating of the manufactured item, and (ii) usage information indicative of usage of the features of the group of features by the evaluation unit.

Step 110 may be followed by step 120 of detecting a memory leakage event, by the memory leakage unit.

Step 120 may be followed by step 130 of disabling an execution, by the evaluation unit, of instructions associated with the first feature at a presence of a memory leakage event.

The disabling may include preventing an execution of the instructions associated with the first feature—if the instructions are not executed when step 120 occurs. The disabling may include stopping the execution of the instructions (or the execution of a software that includes the instructions) if the instructions were executed when step 120 occurs.

Step 130 may include storing a state of execution of instructions associated with the first feature before a disabling of the instructions associated with the first feature.

Method 100 may include step 140 of applying, by an access control unit, access control rules on the usage information.

Step 110 may also include selecting, by the memory leakage unit, one or more additional features out of the group of features.

Step 130 may also include disabling an execution, by the evaluation unit, of instructions associated with the one or more additional features at the presence of the memory leakage event; wherein a priority of each one of the one or more additional features is lower than a priority of the second feature.

Step 105 may be repeated multiple times and the priorities may change over time.

Steps 110, 120 and 130 may be executed multiple times and during each iteration step 110 may select one or more features to be disabled.

This application provides a significant technical improvement over the prior art—especially an improvement in computer science.

Figure 4:
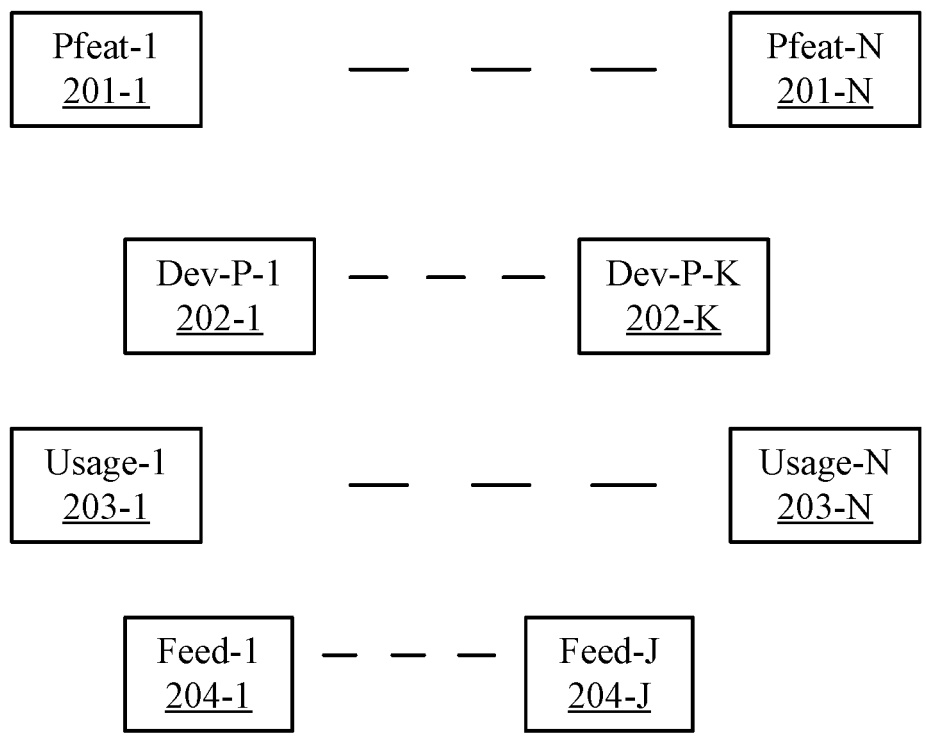
FIG. 4 illustrates examples of feature related metadata.

FIG. 4 illustrates examples of feature related metadata.

Assuming that there is a first number (N) of features Feat-1 till Feat-N, N being an integer that exceeds one. Each feature of the N feature has a priority Pfeat-1 till Pfeat-N 201-1 till 201-N.

At least some of the features may be associated with priority information (denoted Dev-P) provided by one or more developers of the instructions related to the evaluating of the manufactured item. For example—assuming that there are K features that received priority information (whereas K does not exceed N) then there may be K priority information items Dev-P-1 till Dev-P-K 202-1 till 202-K. A priority information item may be verbal—for example critical or non-critical, may be a numerical value, and the like. There may be two or more priority levels defined by the priority information items. The K features associated with Dev-P-1 till Dev-P-K may be any combination of K features out of the N features of the group of features. For example—Dev-P-1 may be associated with any one of Feat-1 till Feat-N.

At least some of the features are associated with usage information indicative of usage of the features of the group of features by the evaluation unit, for example, each feature of the N features has a usage information unit—see, for example Usage-1 till Usage-N 203-1 till 203-N.

One or more of the features may receive feedback from one or more users of the system. For example, assuming that there are J features that received priority information (whereas J does not exceed N) then there may be J feedbacks Feed-1 till Feed-J 204-1 till 204-J. The J features associated with Feed-1 till Feed-J may be any combination of J features out of the N features of the group of features. For example, Feed-J may be associated with any one of Feat-1 till Feat-N.

The feedback may include a white list of features that can be disabled and a black list of features that should not be disabled. The disabling may be conditioned and the feedback may provide conditions for disabling each feature.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

The one or more embodiments of the application may also be implemented in a computer program for running on a computer system, at least including code portions for performing steps of a method according to the one or more embodiments of the application when run on a programmable apparatus, such as a computer system or enabling a programmable apparatus to perform functions of a device or system according to the one or more embodiments of the application. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a computer program product such as non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may for instance include at least one processing unit, associated memory and a number of input/output (I/O) devices. When executing the computer program, the computer system processes information according to the computer program and produces resultant output information via I/O devices.

It will, however, be evident that various modifications and changes may be made therein without departing from the broader spirit and scope of the one or more embodiments of the application as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the one or more embodiments of the application are not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to one or more embodiments of the application containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the one or more embodiments of the application have been illustrated and described herein, many modifications, substitutions, changes, and equivalents will now occur to those of ordinary skill in the art. It is, therefore, to be understood that the appended claims are intended to cover all such modifications and changes as fall within the true spirit of the one or more embodiments of the application.

What is claimed is:

1. A system for evaluating manufactured items, the system comprising:
   a memory module;
   an evaluation unit configured to execute instructions related to the evaluating of the manufactured items while applying a group of features; and
   a memory leakage unit configured to:
   select a first feature out of the group of features, wherein the first feature has a priority that is lower than a priority of a second feature of the group of features, and wherein priorities of features of the group of features are determined based on (i) priority information provided by one or more developers of the instructions related to the evaluating of the manufactured item, and (ii) usage information indicative of usage of the features of the group of features by the evaluation unit; and
   disable the evaluation unit from executing instructions associated with the first feature at a presence of a memory leakage event.

2. The system according to claim 1 further comprising a feature priority module configured to determine the priorities of features of the group of features.

3. The system according to claim 2, wherein the feature priority module is configured to determine the priorities in response to priority feedback provided by one or more users of the system.

4. The system according to claim 2, wherein the feature priority module is configured to determine the priorities by calculating usage related priorities to the features of the group of features, based on the usage information; wherein features of higher usage are allocated with higher usage related priorities.

5. The system according to claim 2, wherein the feature priority module is configured to determine the priorities by allocating less weight to the usage information of features that are labeled as critical in the priority information, in comparison to usage information of features that are not labeled as critical in the priority information.

6. The system according to claim 1, wherein the memory leakage unit is configured to store a state of execution of instructions associated with the first feature before disabling the instructions associated with the first feature.

7. The system according to claim 1 further comprising an access control unit that is configured to apply access control rules on the usage information.

8. The system according to claim 1, wherein the memory leakage unit is configured to detect the memory leakage event, and wherein the memory leakage event is selected out of a current memory leakage event or a future memory leakage event.

9. The system according to claim 1 wherein the memory leakage unit is configured to select one or more additional features out of the group of features; and disable an execution, by the evaluation unit, of instructions associated with the one or more additional features at the presence of the memory leakage event; wherein a priority of each one of the one or more additional features is lower than a priority of the second feature.

10. A method for managing memory leakages of a system for evaluating manufactured items, the method comprising:
    selecting, by a memory leakage unit, a first feature out of a group of features applied by an evaluation unit while executing instructions related to the evaluating of the manufactured items, the evaluation unit belongs to the system for evaluating manufactured items; wherein the first feature has a priority that is lower than a priority of a second feature of the group of features; wherein priorities of features of the group of features are determined based on (i) priority information provided by one or more developers of the instructions related to the evaluating of the manufactured item, and (ii) usage information indicative of usage of the features of the group of features by the evaluation unit; and
    disabling an execution, by the evaluation unit, of instructions associated with the first feature at a presence of a memory leakage event.

11. The method according to claim 10 further comprising determining the priorities of features of the group of features.

12. The system according to claim 11, wherein the determining is also responsive to priority feedback provided by one or more users of the system.

13. The system according to claim 11, wherein the determining the priorities of features comprises calculating usage related priorities to the features of the group of features, based on the usage information; wherein features of higher usage are allocated with higher usage related priorities.

14. The system according to claim 11, wherein the determining of the priorities comprises allocating less weight to the usage information of features that are labeled as critical in the priority information, in comparison to usage information of features that are not labeled as critical in the priority information.

15. The method according to claim 10 further comprising storing a state of execution of instructions associated with the first feature before a disabling of the instructions associated with the first feature.

16. The method according to claim 10 further comprising applying, by an access control unit, access control rules on the usage information.

17. The method according to claim 10 further comprising detecting, by the memory leakage unit, the memory leakage event, wherein the memory leakage event is selected out of a current memory leakage event or a future memory leakage event.

18. The method according to claim 10 further comprising:
    selecting, by the memory leakage unit, one or more additional features out of the group of features; and
    disabling an execution, by the evaluation unit, of instructions associated with the one or more additional features at the presence of the memory leakage event; wherein a priority of each one of the one or more additional features is lower than a priority of the second feature.

19. A non-transitory computer readable medium for managing memory leakages of a system for evaluating manufactured items, the non-transitory computer readable medium stores instructions that once executed by a memory leakage unit, causes the memory leakage unit to:
    select a first feature out of a group of features applied by an evaluation unit while executing instructions related to the evaluating of the manufactured items, the evaluation unit belongs to the system for evaluating manufactured items; wherein the first feature has a priority that is lower than a priority of a second feature of the group of features; wherein priorities of features of the group of features are determined based on (i) priority information provided by one or more developers of the instructions related to the evaluating of the manufactured item, and (ii) usage information indicative of usage of the features of the group of features by the evaluation unit; and
    disable an execution, by the evaluation unit, of instructions associated with the first feature at a presence of a memory leakage event.

20. The non-transitory computer readable medium according to claim 19 further comprising instructions for determining priorities of features of the group of features.

* * * * *